(12) United States Patent
Karasawa (10) Patent No.: US 9,832,903 B2
(45) Date of Patent: Nov. 28, 2017

(54) POWER SEMICONDUCTOR MODULE DEVICE

(71) Applicant: FUJI ELECTRIC CO., LTD., Kawasaki-shi (JP)

(72) Inventor: Tatsuya Karasawa, Shiojiri (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 165 days.

(21) Appl. No.: 14/838,696

(22) Filed: Aug. 28, 2015

(65) Prior Publication Data

US 2016/0095244 A1    Mar. 31, 2016

(30) Foreign Application Priority Data

Sep. 26, 2014    (JP) .................................. 2014-195991

(51) Int. Cl.
*H05K 7/14*    (2006.01)
*H01R 31/06*    (2006.01)

(52) U.S. Cl.
CPC ........... *H05K 7/1432* (2013.01); *H01R 31/06* (2013.01)

(58) Field of Classification Search
None
See application file for complete search history.

(56) References Cited

U.S. PATENT DOCUMENTS

| 4,176,904 | A | * | 12/1979 | Obuch | H01R 24/76 439/690 |
| 4,984,383 | A | * | 1/1991 | Mummey | H01R 13/629 439/259 |
| 5,035,627 | A | * | 7/1991 | Burnett | H01R 23/68 439/152 |
| 5,361,189 | A | * | 11/1994 | Miyashita | H01L 23/49562 257/E23.044 |
| 5,579,211 | A | * | 11/1996 | Hendel | H01H 50/048 361/729 |

(Continued)

FOREIGN PATENT DOCUMENTS

| JP | 2692449 B | 4/1993 |
| JP | H11-067396 A | 3/1999 |

(Continued)

*Primary Examiner* — Xanthia C Cunningham
(74) *Attorney, Agent, or Firm* — Rabin & Berdo, P.C.

(57) ABSTRACT

Second fixation portions of a terminal conversion adaptor are fitted into and engaged with engagement portions abutting on first fixation portions of a power semiconductor module. By use of one common fixation screw, each of the fixation portions and each of the second fixation portions are fixed to a cooler. Pin connection type external connection terminals of the power semiconductor module are connected to conversion terminals (which are provided with screw connection portions) of the terminal conversion adaptor so that the pin connection type external connection terminals can be converted into screw connection. Thus, it is possible to provide a conversion adaptor which can convert a connection form of each external connection terminal of a power semiconductor module easily and a power semiconductor module device in which the connection form of the external connection terminal can be converted into a desired connection form by the conversion adaptor.

15 Claims, 7 Drawing Sheets

(56) References Cited

U.S. PATENT DOCUMENTS

| | | | | |
|---|---|---|---|---|
| 6,821,135 | B1* | 11/2004 | Martin | H01R 13/629 439/141 |
| 6,940,021 | B2* | 9/2005 | Pohl | H01H 9/10 174/137 R |
| 9,159,514 | B2* | 10/2015 | Weber | H01H 50/048 |
| 9,516,776 | B2* | 12/2016 | Kawamura | H01H 50/048 |
| 2010/0078807 | A1* | 4/2010 | Schulz | H01L 23/34 257/713 |
| 2010/0222101 | A1* | 9/2010 | Aoki | G06F 1/1626 455/557 |
| 2013/0027570 | A1 | 1/2013 | Kinoshita | |

FOREIGN PATENT DOCUMENTS

| | | |
|---|---|---|
| JP | 2000-040568 A | 2/2000 |
| JP | 2000-174178 A | 6/2000 |
| JP | 2013-030122 A | 2/2013 |

\* cited by examiner

SECTION TAKEN ALONG LINE A-A

SECTION TAKEN ALONG LINE A-A

POWER SEMICONDUCTOR MODULE DEVICE

CROSS-REFERENCE TO RELATED APPLICATION

This application is based on, and claims priority to, Japanese Patent Application No. 2014-195991, filed on Sep. 26, 2014, the contents of which are entirely incorporated herein by reference.

BACKGROUND OF THE INVENTION

1. Field of the Invention

The present invention relates to a power semiconductor module device in which a connection form of an external connection terminal of a power semiconductor module can be converted by a conversion adaptor.

2. Description of the Background Art

Power semiconductor modules have been used in power conversion circuits for electric power devices such as power supplies or electric motors or for applications thereof such as refrigerators, air conditioners, machine tools, hybrid cars, electric cars, or the like. There are a wide variety of forms in these electric power products. For wiring in a power portion of a power semiconductor module, a wire harness may be used in one case while a printed circuit board may be used in another case. A suitable connection form for each intended purpose has been requested.

For example, when a wire harness is connected to a power semiconductor module, there has been broadly used a method in which an external connection terminal having a screw hole is provided and disposed in a housing of the power semiconductor module and a crimped terminal attached to a front end of the wire harness is screw-connected to the external connection terminal by use of a fixation screw fastened to the screw hole. On the other hand, when a power semiconductor module is connected to a printed circuit board, there has been broadly used a method in which a pin terminal is provided and disposed on a surface of the power semiconductor module facing the printed circuit board, and the pin terminal is inserted into a through hole of the printed circuit board and soldered thereto.

As an embodiment, Japanese Patent No. 2692449 discloses a power semiconductor module in which a flat plate-like external connection terminal having a screw hole is provided and disposed on a mounting surface of the power semiconductor module to be attached onto a printed circuit board so that the external connection terminal can be screw-connected to a hole-including terminal portion on the printed circuit board, by use of a fixation screw fastened to the screw hole. In addition, as another embodiment using a different system from the aforementioned system, Japanese Patent No. 2692449 discloses a power semiconductor module in which a pin-shaped external connection terminal extending perpendicularly to a mounting surface of the power semiconductor module to be attached onto a printed circuit board is provided and disposed on the mounting surface and inserted and connected to a connector on the printed circuit board.

When such power semiconductor modules are installed in their application products, the connection form of the external terminal in one product differs from that in another. Therefore, users may often feel inconvenience even if the electric specifications of the products are suited to their purposes. In fact, the connection forms of the external terminals cannot be ignored but become an important factor directly affecting miniaturization, cost reduction and maintainability of the application products.

However, when power semiconductor modules having different terminal shapes are produced in parallel, demand prediction for each module is more difficult than expected and one of the modules is highly likely to be left in useless stock. This is therefore economically unfavorable. A recent power semiconductor module includes not only a power semiconductor element but also a pre-driver circuit for performing pulse width modulation control on the power semiconductor element and a protection circuit for breaking a circuit against an overcurrent, an overvoltage or an excessive temperature rise. The power semiconductor module enhanced thus as a value-added product is so expensive that the uselessness must be avoided. In addition, there also arises directly economic inefficiency that two or more kinds of molds have to be prepared.

SUMMARY OF THE INVENTION

Therefore, an object of the invention is to provide a conversion adaptor which can convert a connection form of an external connection terminal of a power semiconductor module easily and a power semiconductor module device in which the connection form of the external connection terminal can be converted into a desired connection form by the conversion adaptor.

In order to achieve the object, the invention provides a power semiconductor module device including: a power semiconductor module in which an external connection terminal conductively connected to the outside in a first connection form is disposed on at least a part of an outer edge; and a terminal conversion adaptor which includes a conductive member and an insulating support member, the conductive member including a first connection portion connected to the external connection terminal and a second connection portion serving as a second connection form different from the first connection form, the insulating support member supporting the conductive member.

According to the invention, the terminal conversion adaptor is attached to the power semiconductor module having the external connection terminal conductively connected to the outside in the first connection form. In this manner, the power semiconductor module device can be connected to the outside in the second connection form different from the first connection form. Accordingly, it is not necessary to produce power semiconductor modules having different terminal shapes in parallel but it is possible to reduce a useless stock and the manufacturing cost of molds.

In the power semiconductor module device according to the invention, preferably, the power semiconductor module includes a first fixation portion which is fixed to a cooler, and the support member of the terminal conversion adaptor includes a second fixation portion which is fixed to a part of the first fixation portion.

According to the aforementioned aspect, the terminal conversion adaptor can be fixed to the power semiconductor module by the second fixation portion. Accordingly, it is possible to connect the power semiconductor module device to the outside through the terminal conversion adaptor easily.

In the power semiconductor module device according to the invention, preferably, the first fixation portion and the support member of the terminal conversion adaptor are provided with engagement portions which can be engaged with each other.

According to the aforementioned aspect, the terminal conversion adaptor can be temporarily fixed to the power semiconductor module by the engagement portions. Accordingly, it is possible to perform the connection work between the power semiconductor module and the terminal conversion adaptor easily.

In the power semiconductor module device according to the invention, preferably, one of the engagement portions of the first fixation portion and the support member of the terminal conversion adaptor is a recess and the other engagement portion is a protrusion.

According to the aforementioned aspect, it is possible to temporarily fix the terminal conversion adaptor to the power semiconductor module by recess/protrusion fitting between the engagement portions.

In the power semiconductor module device according to the invention, preferably, the first fixation portion and the second fixation portion are fixed to each other through one common screw.

According to the aforementioned aspect, it is also possible to fix the second fixation portion of the terminal conversion adaptor concurrently when the first fixation portion provided in the power semiconductor module is fixed to the cooler.

In the power semiconductor module device according to the invention, preferably, the outer shape of the power semiconductor module is a polygon in section, and the support member of the terminal conversion adaptor is formed into a shape which can be tangent to at least three sides of the polygon of the outer circumference of the power semiconductor module.

According to the aforementioned aspect, the support member of the terminal conversion adaptor is formed into the shape which can be tangent to at least three sides of the polygon of the outer circumference of the power semiconductor module. In this manner, it is possible to attach the terminal conversion adaptor to the power semiconductor module easily.

In one aspect of the power semiconductor module device according to the invention, preferably, the first connection form of the external connection terminal of the power semiconductor module is screw connection, and the second connection form of the second connection portion of the terminal conversion adaptor is insertion connection.

According to the aforementioned aspect, the screw connection type external connection terminal provided in the power semiconductor module can be changed to insertion connection easily.

In another aspect of the power semiconductor module device according to the invention, preferably, the first connection form of the external connection terminal of the power semiconductor module is insertion connection, and the second connection form of the second connection portion of the terminal conversion adaptor is screw connection.

According to the aforementioned aspect, the insertion connection type external connection terminal provided in the power semiconductor module can be changed to screw connection easily.

In one aspect of the power semiconductor module device according to the invention, preferably, the terminal conversion adaptor is disposed on a side surface of the power semiconductor module.

In the aforementioned aspect, it is possible to prevent the thickness of the power semiconductor module device from increasing. Accordingly, it is possible to apply the power semiconductor module device in the case where there is a limit on a space in the thickness direction.

In another aspect of the power semiconductor module device according to the invention, preferably, the terminal conversion adaptor is disposed on an upper surface of the power semiconductor module.

In the aforementioned aspect, it is possible to prevent the width of the outer circumference of the power semiconductor module device from increasing. Accordingly, it is possible to apply the power semiconductor module device in the case where there is a limit on a space in the outer circumference direction.

In the power semiconductor module device according to the invention, preferably, the insertion connection is performed in such a manner that a pin-shaped terminal portion or a hole-including terminal portion is provided, and the pin-shaped terminal portion is inserted into a hole-including terminal portion of a mated member to be connected, and bonded thereto by soldering, or a pin-shaped terminal portion of a mated member to be connected is inserted into the hole-including terminal portion and bonded thereto by soldering.

According to the aforementioned aspect, the pin-shaped terminal portion can be temporarily fixed to the hole-including terminal portion when the pin-shaped terminal portion is inserted into the hole-including terminal portion. When the both in that state are bonded by soldering, they can be connected surely.

In the power semiconductor module device according to the invention, preferably, the screw connection is performed in such a manner that a through hole into which a bolt can be inserted or a screw hole to which a bolt can be screwed is provided so that the power semiconductor module device can be fixed to a mated member to be connected, through the bolt.

According to the aforementioned aspect, it is possible to fix the power semiconductor module device to the mated member to be connected, through the bolt. Accordingly, it is possible to secure electric connection and attain structurally strong connection between the power semiconductor module device and the mated member.

According to the invention, the terminal conversion adaptor is attached to the power semiconductor module having the external connection terminal conductively connected to the outside in the first connection form. In this manner, the power semiconductor module can be connected to the outside in the second connection form different from the first connection form. Accordingly, a plurality of kinds of power semiconductor module devices with different connection forms of external connection terminals can be produced from one kind of power semiconductor modules and supplied inexpensively. In addition, it is not necessary to produce power semiconductor modules with different terminal shapes in parallel so that it is possible to reduce a useless stock and the manufacturing cost of molds.

DETAILED DESCRIPTION OF THE INVENTION

Embodiments of semiconductor module devices according to the invention will be described below with reference to the drawings. The same constituent members will be referred to by the same numerals or signs respectively and correspondingly and duplicate description thereof will be omitted. Incidentally, the invention is not limited to the following embodiments but can be modified suitably and carried out without changing the scope and spirit of the invention.

[Pin Connection Type Power Semiconductor Module]

A pin connection type power semiconductor module will be described as an example of a power semiconductor module used in a power semiconductor module device according to the invention.

Figure 1A:
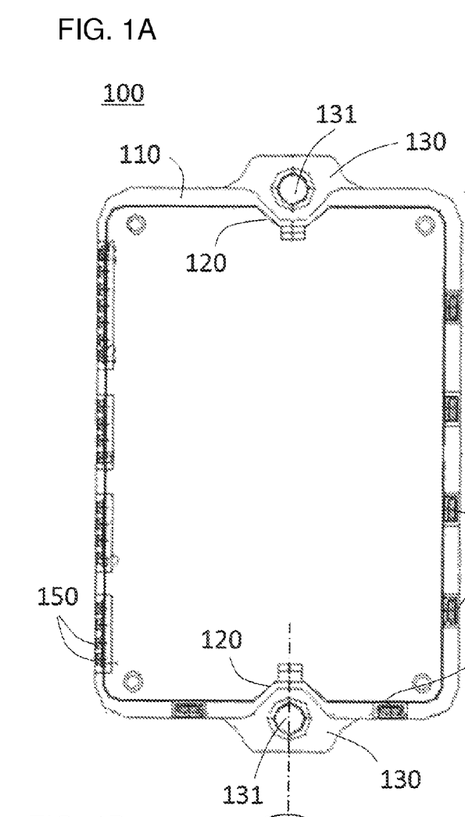
FIGS. 1A to 1C are a top view and side views of an embodiment of a pin connection type power semiconductor module according to the invention.
Figure 1B:
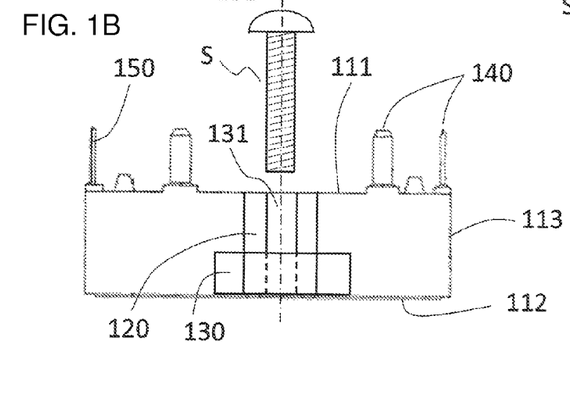
Figure 1C:
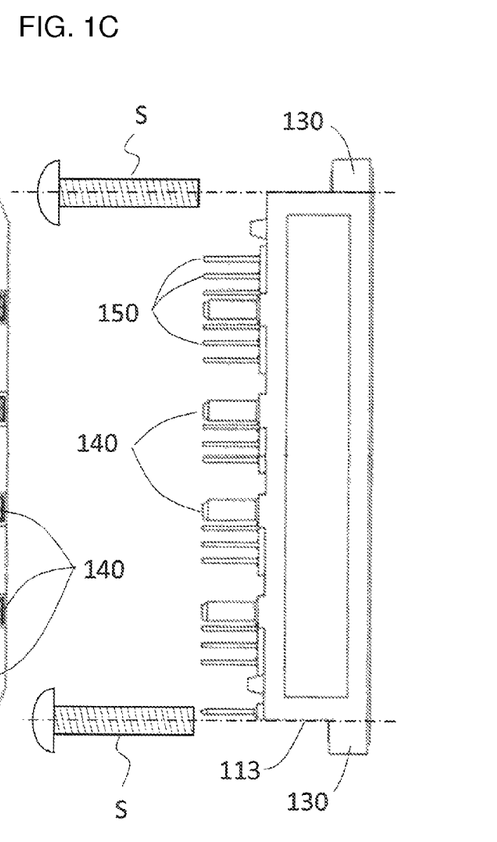

A top view, a side view (seen from front) and a side view (seen from right) of a power semiconductor module 100 used in the invention are shown in FIGS. 1A, 1B and 1C respectively.

A casing 110 of the power semiconductor module 100 is substantially shaped like a rectangular parallelepiped. The casing 110 is constituted by an upper surface 111, a lower surface 112, and a side surface 113. The upper surface 111 faces a printed circuit board. The lower surface 112 abuts on a cooler. The side surface 113 surrounds the upper surface 111 and the lower surface 112. An engagement portion 120 engaged with a terminal conversion adaptor and a first fixation portion 130 fixed to the cooler are provided in each of two places of the side surface 113. The engagement portion 120 includes a recess formed in the side surface 113 and can be fitted into and engaged with a second fixation portion 220 of the terminal conversion adaptor which will be described later. The first fixation portion 130 protrudes from the side surface 113 of the casing 110 in a position tangent to the engagement portion 120. The first fixation portion 130 is provided with a screw insertion hole 131. A fixation screw S can be inserted into the screw insertion hole 131 and fastened to a corresponding screw hole of the not-shown cooler so that the power semiconductor module 100 can be fixed to the cooler.

Pin connection type external connection terminals 140 and control terminals 150 are disposed in outer edges of the upper surface 111 of the casing 110 to extend perpendicularly to the upper surface 111. The surfaces of the external connection terminals 140 and the surfaces of the control terminals 150 are plated with tin and copper. When the power semiconductor module 100 is pin-connected to the printed circuit board, the external connection terminals 140 and the control terminals 150 can be inserted into hole-including terminals of the not-shown printed circuit board and soldered thereto.

[Screw Connection Type Terminal Conversion Adaptor]

An embodiment of a screw connection type terminal conversion adaptor will be described as an example of a terminal conversion adaptor used in the power semiconductor module device according to the invention.

Figure 2A:
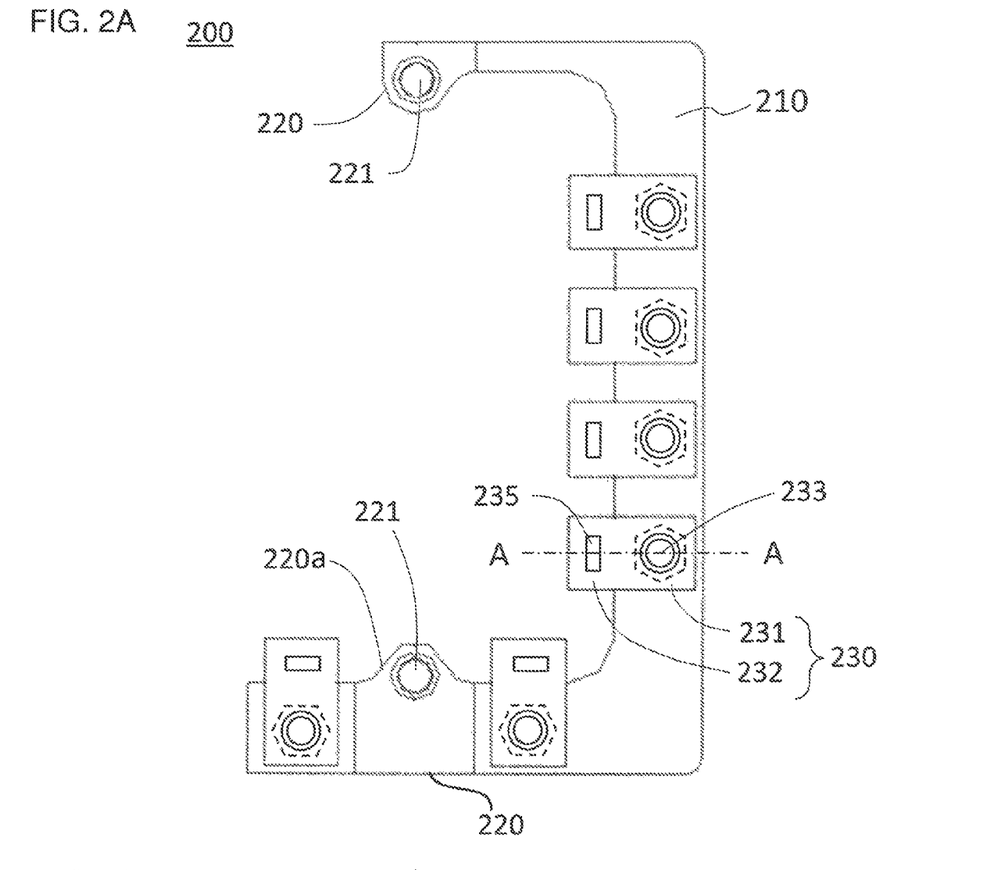
FIGS. 2A and 2B are a top view and a side view of an embodiment of a screw connection type terminal conversion adaptor according to the invention.
Figure 2B:
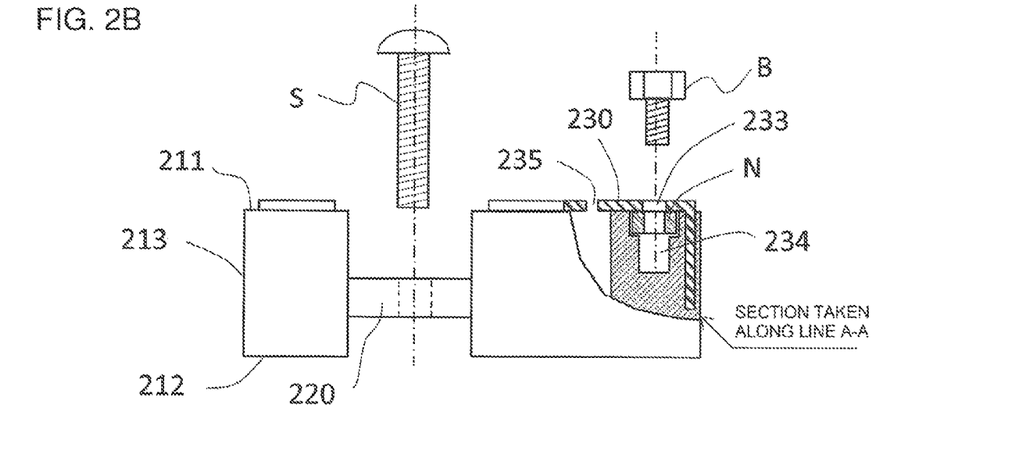

A top view and a side view of a terminal conversion adaptor 200 used in the invention are shown in FIGS. 2A and 2B respectively. The screw connection type terminal conversion adaptor 200 can be used for terminal conversion of the pin connection type power semiconductor module 100 to convert pin connection into screw connection.

A support member 210 of the terminal conversion adaptor 200 is substantially formed into a U-shape. The support member 210 is constituted by an upper surface 211, a lower surface 212 and a side surface 213. The upper surface 211 of the support member 210 faces in the same direction as the upper surface 111 of the power semiconductor module 100. The lower surface 212 of the support member 210 faces in the same direction as the lower surface 112 of the power semiconductor module 100. The side surface 213 surrounds the upper surface 211 and the lower surface 212 of the support member 210. A second fixation portion 220 is provided in each of two places of the side surface 213 of the support member 210. The second fixation portion 220 includes a protrusion (second engagement portion 220a) formed in the side surface 213. The second fixation portions 220 are fitted into the engagement portions 120 of the power semiconductor module 100 so that the terminal conversion adaptor 200 can be engaged with the power semiconductor module 100 so as to be tangent to three outer side surfaces of the power semiconductor module 100. Each of the second fixation portions 220 is provided with a screw insertion hole 221. A fixation screw S can be inserted into the screw insertion hole 221 so that the second fixation portion 220 can be fixed to the cooler. Incidentally, the support member 210 is preferably made of an insulating material with good formability. A thermoplastic resin such as a PPS resin or a PBS resin can be used as the material of the support member 210.

On the other hand, conversion terminals 230 for converting pin connection into screw connection are disposed on the upper surface 211 of the support member 210. Each of the conversion terminals 230 is embedded in the support member 210 at its one end and bent into an L-shape outside the support member 210. The conversion terminal 230 extends across the upper surface 211 and protrudes inward from an inner edge of the support member 210. Of the conversion terminal 230, a part abutting on the upper surface 211 of the support member 210 forms a screw connection portion 231 and a part protruding from the support member 210 forms a pin connection portion 232.

The screw connection portion 231 has a bolt insertion hole 233. The surface of the screw connection portion 231 is plated with nickel. In the support member 210, a bolt insertion hole 234 is formed in a position in line with the bolt insertion hole 233. An inlet of the bolt insertion hole 234 is machined into a hexagonal shape so that a hexagonal nut N can be retained inside the inlet of the bolt insertion hole 234. The bolt insertion hole 234 is disposed to be in line with an internal thread of the hexagonal nut N.

On the other hand, the pin connection portion 232 has a pin insertion hole 235. The pin-shaped external connection terminal 140 of the power semiconductor module 100 can be inserted into the pin insertion hole 235 and soldered thereto.

[Screw Connection Type Power Semiconductor Module Device]

A screw connection type power semiconductor module device in which the terminal conversion adaptor 200 shown in FIGS. 2A and 2B is attached to the power semiconductor module 100 shown in FIGS. 1A to 1C will be described as an embodiment of the power semiconductor module device according to the invention.

Figure 3A:
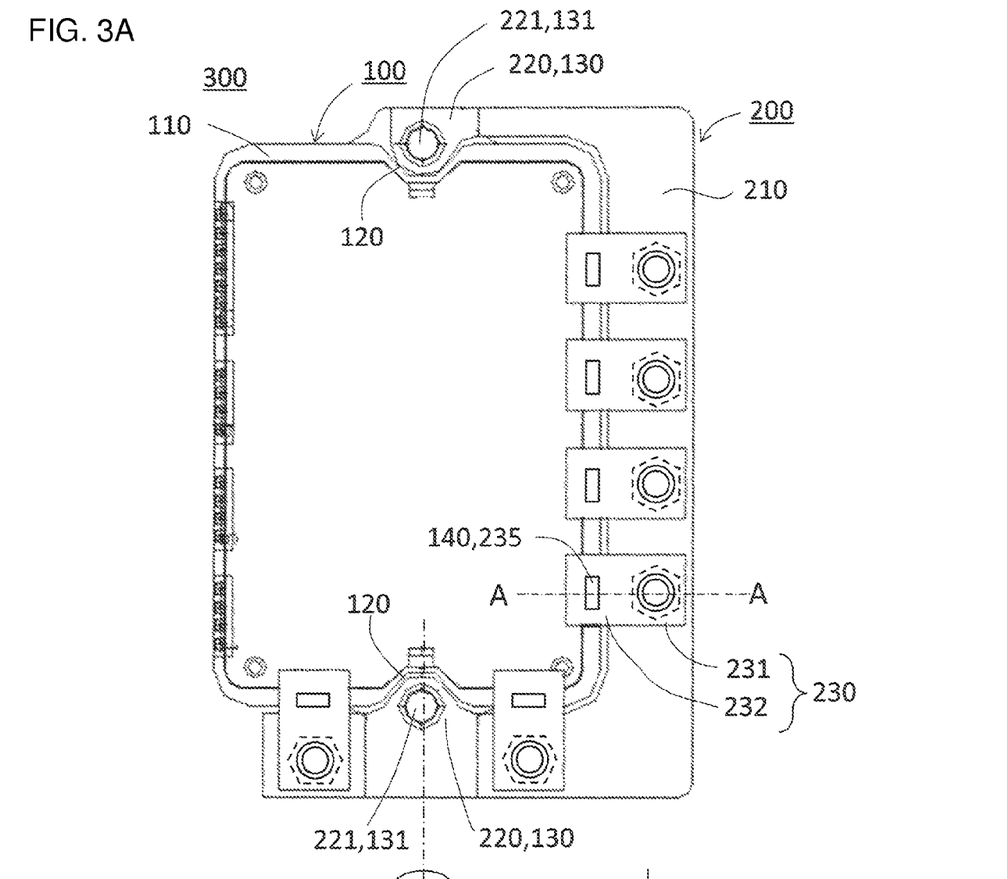
FIGS. 3A and 3B are a top view and a side view of an embodiment of a screw connection type power semiconductor module device according to the invention.
Figure 3B:
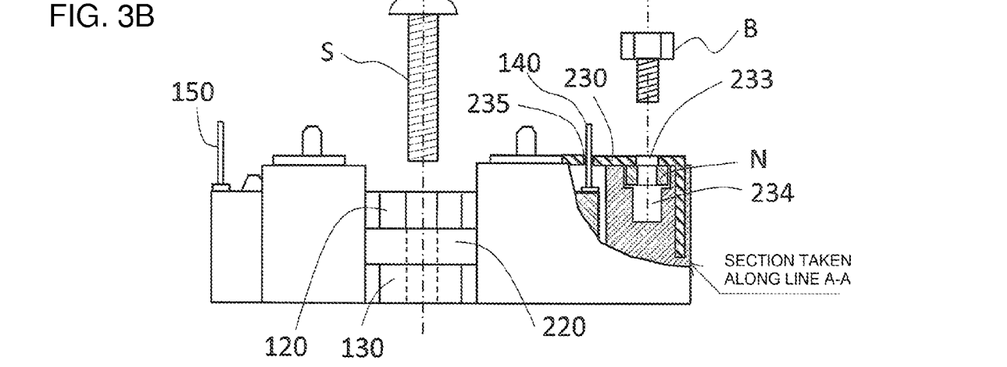

A top view and a side view of the aforementioned power semiconductor module device 300 are shown in FIGS. 3A and 3B respectively. The power semiconductor module device 300 includes the semiconductor module 100 and the conversion adaptor 200. The recesses of the engagement portions 120 of the power semiconductor module 100 and the protrusions of the second fixation portions 220 of the terminal conversion adaptor 200 are fitted into each other. The terminal conversion adaptor 200 is fitted onto the power semiconductor module 100 from the direction of the upper surface 111 (see FIGS. 1A to 1C) of the power semiconductor module 100. In this condition, the first fixation portions 130 and the second fixation portions 220 are arranged in line with each other and the screw insertion holes 131 and the screw insertion holes 221 are arranged in line with each other. Accordingly, one common fixation screw S can be inserted into each insertion hole 221 and each insertion hole 131 communicating with each other, and fastened to each screw hole of the cooler so that the power semiconductor module device 300 can be fixed to the cooler.

On the other hand, the external connection terminals 140 of the power semiconductor module 100 are inserted into the pin insertion holes 235 of the terminal conversion adaptor 200 and soldered thereto so that the external connection terminals 140 can be electrically connected to the pin connection portions 232 respectively. Each of the conversion terminals 230 has the bolt insertion hole 233 provided in the screw connection portion 231. A terminal fastening bolt B is inserted into the bolt insertion hole 233 and screwed into the hexagonal nut N retained in the bolt insertion hole 234 so that a terminal portion of a wire harness can be fastened to the external connection terminal 140.

According to the aforementioned configuration, the screw connection type power semiconductor module device 300 can be produced easily from the pin connection type power semiconductor module 100 and the terminal conversion adaptor 200. Accordingly, only the pin connection type is required to be produced as the power semiconductor module so that stock management can be easier than that in a parallel production system of a pin connection type and a screw connection type according to the background art. Thus, it is possible to provide each connection type power semiconductor module device inexpensively in the market.

[Modification of Screw Connection Type Power Semiconductor Module Device]

Another embodiment of the screw connection type power semiconductor module device according to the invention will be described.

Figure 4A:
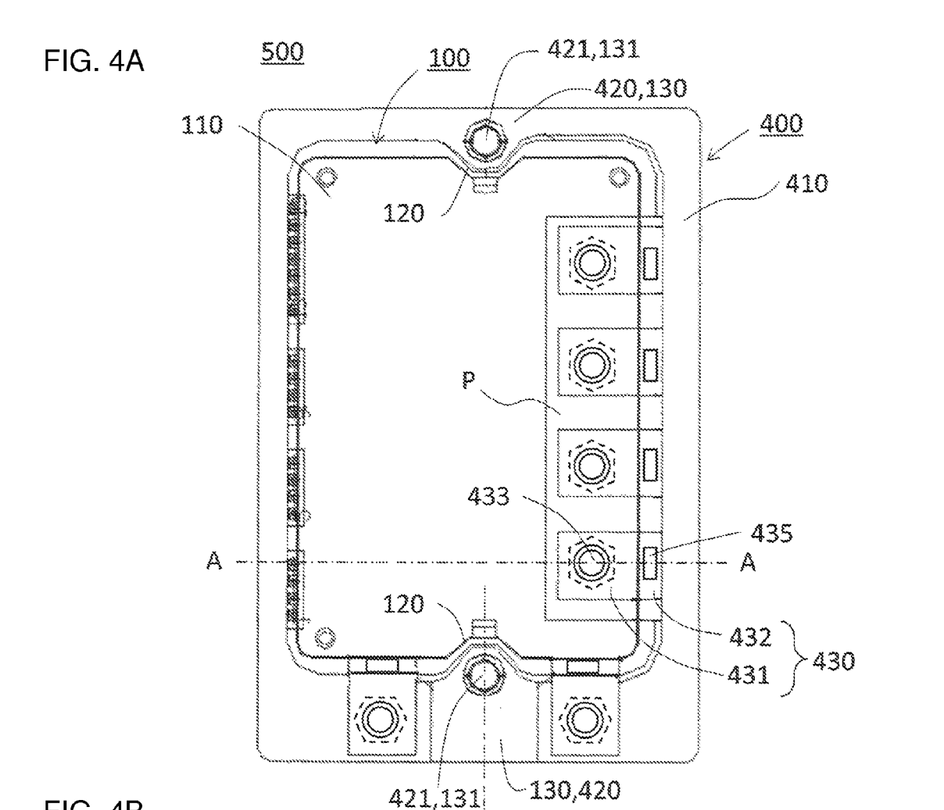
FIGS. 4A and 4B are a top view and a side view of another embodiment of the screw connection type power semiconductor module device according to the invention.
Figure 4B:
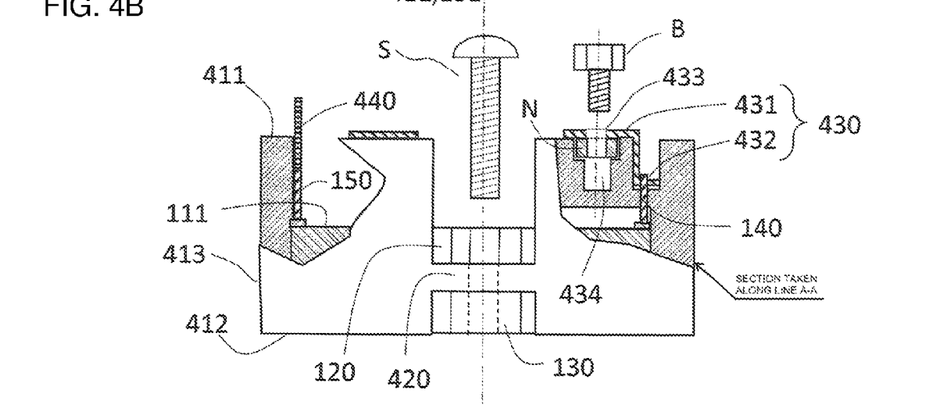

A top view and a side view of the aforementioned power semiconductor module device 500 will be shown in FIGS. 4A and 4B respectively. The power semiconductor module device 500 includes a semiconductor module 100 and a conversion adaptor 400.

In the embodiment, screw connection portions 431 of conversion terminals 430 are disposed above the power semiconductor module 100. In order to vertically stack the screw connection portions 431 in a support member 410 of the terminal conversion adaptor 400, the support member 410 has an upper surface 411 made higher than an upper surface 111 of the semiconductor module 100 and is engaged with the semiconductor module 100 to surround four sides of the semiconductor module 100 in a square shape. The support member 410 protrudes above the semiconductor module 100 on the side where four external connection terminals 140 are disposed.

The conversion terminals 430 are disposed on the upper surface 411 of a protruding portion P of the support member 410. One ends of the conversion terminals 430 are embedded and fixed in the support member 410. In addition, each of the conversion terminals 430 has a screw connection portion 431 and a pin connection portion 432. The screw connection portion 431 is plated with nickel and provided with a bolt insertion hole 433. The pin connection portion 432 is provided with a pin insertion hole 435.

Bolt insertion holes 434 are formed in positions in line with the bolt insertion holes 433 in the protruding portion P of the support member 410. Each of inlets of the bolt insertion holes 434 is machined into a hexagonal shape. A hexagonal nut N is retained inside the inlet of the bolt insertion hole 434.

On the other hand, screw connection portions 431 of two conversion terminals 430 are disposed outside the outer circumference of the semiconductor module 100 on the side where two external connection terminals 140 are disposed. The two conversion terminals 430 are as high as the four terminals in the protruding portion P.

In addition, front ends of control terminals 150 of the semiconductor module 100 are lower than the upper surface 411 of the support member 410. Accordingly, the front ends of the control terminals 150 can be relayed by relay pins 440 so as to be higher than the upper surface 411 of the support member 410 and connected to a printed circuit board etc.

According to the aforementioned configuration, the width of the power semiconductor module device 500 can be prevented from increasing.

[Screw Connection Type Power Semiconductor Module]

A screw connection type power semiconductor module will be described as another example of the power semiconductor module used in the power semiconductor module device according to the invention.

Figure 5A:
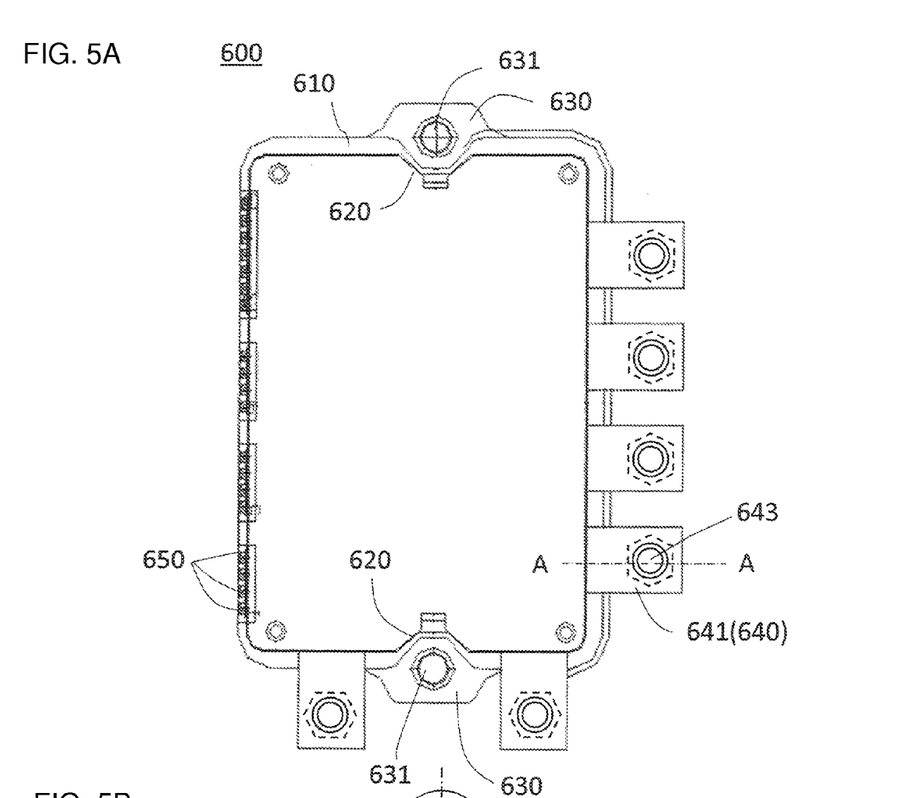
FIGS. 5A and 5B are a top view and a side view of an embodiment of a screw connection type power semiconductor module according to the invention.
Figure 5B:
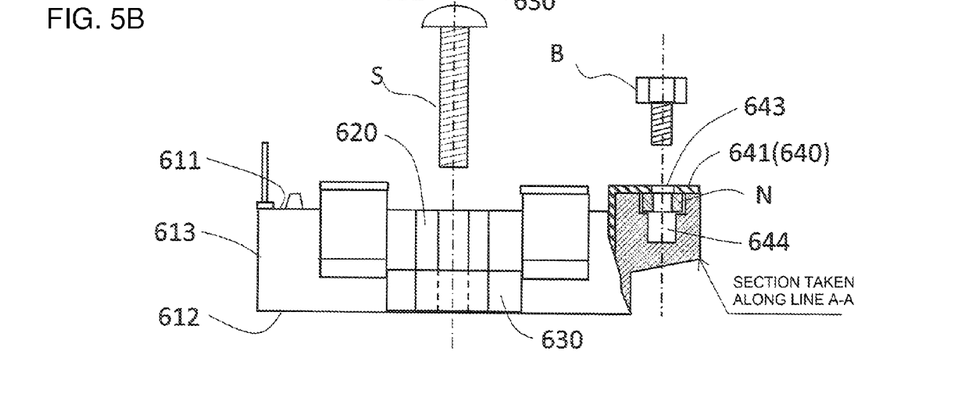

A top view and a side view of a screw connection type power semiconductor module 600 are shown in FIGS. 5A and 5B respectively.

A casing 610 of the power semiconductor module 600 is substantially shaped like a rectangular parallelepiped. The casing 610 is constituted by an upper surface 611, a lower surface 612, and a side surface 613. The upper surface 611 faces a printed circuit board. The lower surface 612 abuts on a cooler. The side surface 613 surrounds the upper surface 611 and the lower surface 612. An engagement portion 620 engaged with a terminal conversion adaptor and a first fixation portion 630 fixed to the cooler are provided in each of two places of the side surface 613. The engagement portions 620 include recesses formed in the side surface 613 so that a second fixation portion 720 of the terminal conversion adaptor which will be described later can be fitted into and engaged with one of the engagement portions 620. Each of the first fixation portions 630 protrudes from the side surface 613 of the casing 610 in a position tangent to a corresponding one of the engagement portions 620, and has a screw insertion hole 631. A fixation screw S can be inserted into the screw insertion hole 631 and fastened to a corresponding screw hole of the not-shown cooler so that the power semiconductor module 600 can be fixed to the cooler.

Screw connection portions 641 are disposed to protrude outward from the casing 610. Each of external connection terminals 640 is embedded in the casing 610 at its one end and bent on the inner side to extend outside the casing 610 and in parallel with the upper surface 611. The surfaces of the external connection terminals 640 are plated with nickel. Bolt insertion holes 643 are provided in the external connection terminals 640 respectively. Bolt insertion holes 644 arranged in line with the bolt insertion holes 643 are formed in a protruding portion of the casing 610 where the external connection terminals 640 are arranged. Each of inlets of the bolt insertion holes 644 is machined into a hexagonal shape and a hexagonal nut N is retained inside the inlet of the bolt insertion hole 644. When a wire harness is screw-connected to the power semiconductor module 600, a terminal fastening bolt B can be inserted into each bolt insertion hole 643 and screwed to each hexagonal nut N retained in each bolt insertion hole 644 so that a terminal portion of the wire harness can be fastened by the terminal fastening bolt B.

Pin connection type control terminals 650 for inputting/outputting a control signal are disposed on an outer edge of the casing 610 and extend perpendicularly to the upper surface 611. The surfaces of the control terminals 650 are plated with tin and copper. The control terminals 650 can be inserted into hole-including terminals of the not-shown printed circuit board and soldered thereto.

[Pin Connection Type Terminal Conversion Adaptor]

A pin connection type terminal conversion adaptor will be described as another example of the terminal conversion adaptor used in the power semiconductor module device according to the invention.

Figure 6A:
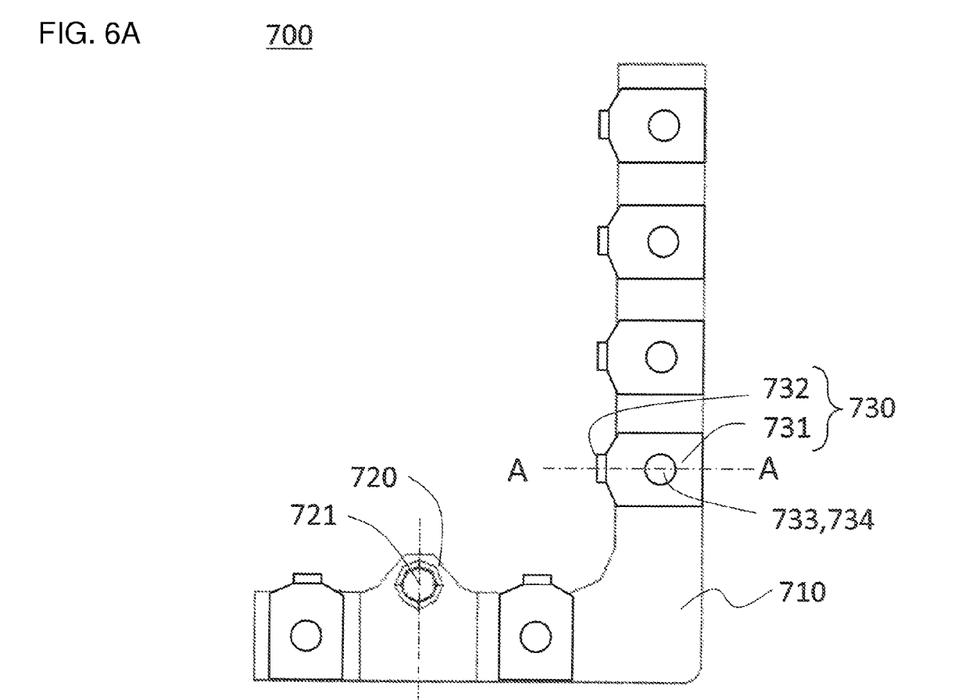
FIGS. 6A and 6B are a top view and a side view of an embodiment of a pin connection type terminal conversion adaptor according to the invention.
Figure 6B:
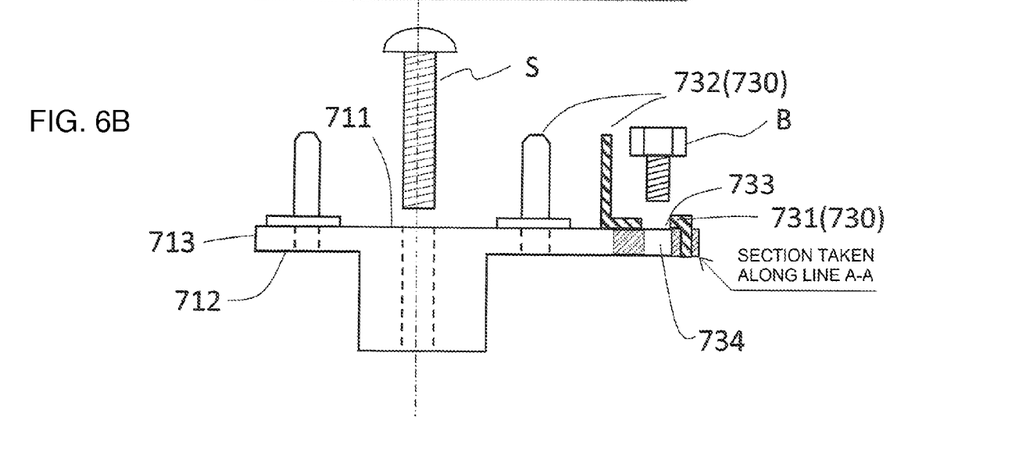

A top view and a side view of the terminal conversion adaptor 700 are shown in FIGS. 6A and 6B respectively. The pin connection type terminal conversion adaptor 700 can be used for terminal conversion of the screw connection type power semiconductor module 600 to convert screw connection into pin connection.

A support member 710 of the pin connection type terminal conversion adaptor 700 is substantially formed into an L-shape. The support member 710 is constituted by an upper surface 711, a lower surface 712 and a side surface 713. The upper surface 711 of the support member 710 faces in the same direction as the upper surface 611 of the power semiconductor module 600. The lower surface 712 of the support member 710 faces in the same direction as the lower surface 612 of the power semiconductor module 600. The side surface 713 surrounds the upper surface 711 and the lower surface 712 of the support member 710. A second fixation portion 720 is provided in one place of the side surface 713. The second fixation portion 720 includes a protrusion formed in the side surface 713. The second fixation portion 720 is fitted into a corresponding one of the engagement portions 620 of the power semiconductor module 600 so that the terminal conversion adaptor 700 can be engaged with the power semiconductor module 600 to be tangent to two outer side surfaces of the power semiconductor module 600. The second fixation portion 720 is provided with a screw insertion hole 721. A fixation screw S is inserted into the screw insertion hole 721 so that the second fixation portion 720 can be fixed to the cooler. Incidentally, the support member 710 is preferably made of an insulating material with good formability. A thermoplastic resin such as a PPS resin or a PBS resin can be used as the material of the support member 710.

Conversion terminals 730 for converting screw connection into pin conversion are disposed on the upper surface 711 of the support member 710. Each conversion terminal 730 is bent to extend along the upper surface 711 outside the support member 710 so as to form a screw connection portion 731. The conversion terminal 730 is bent again perpendicularly to the upper surface 711 in the vicinity of an outer edge of the support member 710 so as to form a pin connection portion 732.

The screw connection portion 731 has a bolt insertion hole 733. The surface of the screw connection portion 731 is plated with nickel. Further, in the support member 710, a bolt insertion hole 734 is formed in a position in line with the bolt insertion hole 733 so that a terminal fastening bolt B can be inserted into the bolt insertion hole 734.

On the other hand, the pin connection portion 732 is plated with tin and copper and soldered to a printed circuit board etc.

[Pin Connection Type Power Semiconductor Module Device]

A pin connection type power semiconductor module device in which the terminal conversion adaptor 700 shown in FIGS. 6A and 6B is attached to the power semiconductor module 600 shown in FIGS. 5A and 5B will be described as another embodiment of the power semiconductor module device according to the invention.

Figure 7A:
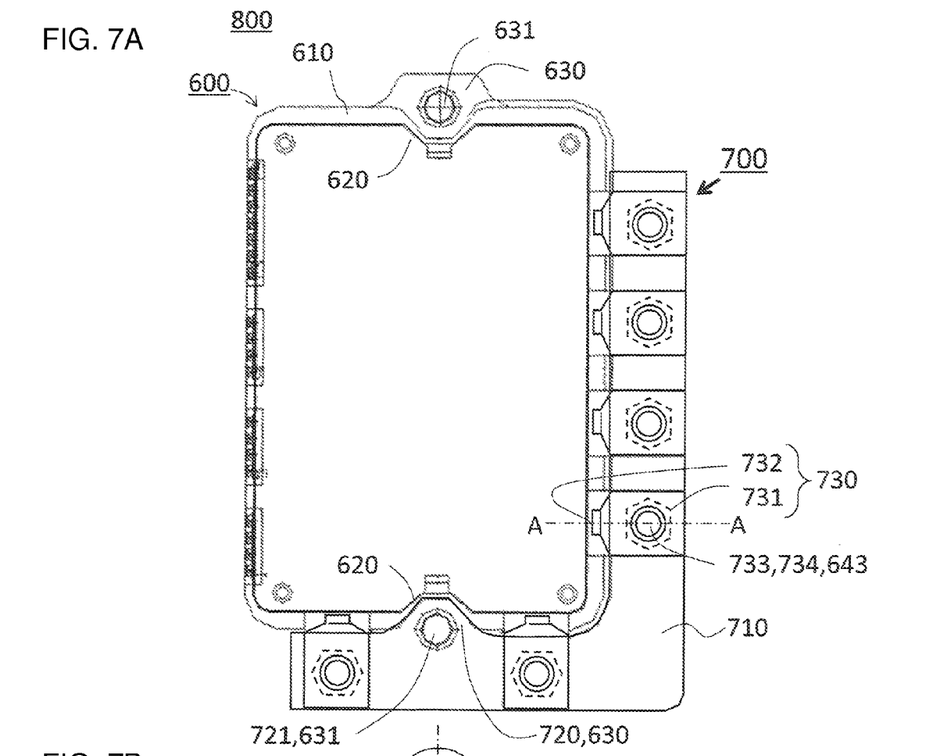
FIGS. 7A and 7B are a top view and a side view of an embodiment of a pin connection type power semiconductor module device according to the invention.
Figure 7B:
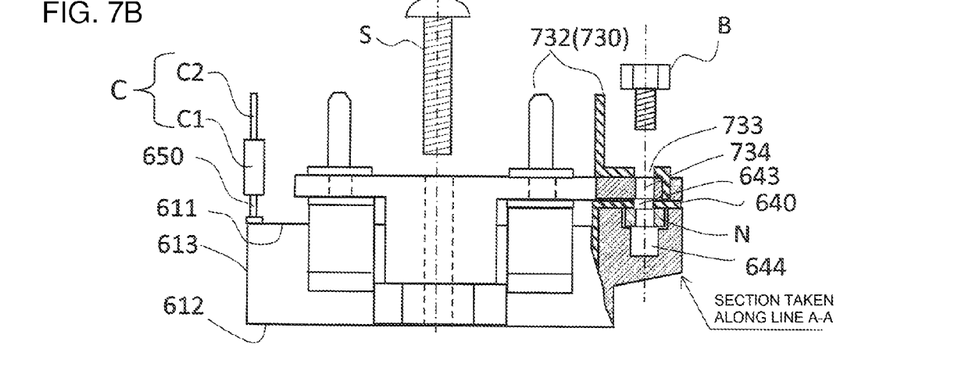

A top view and a side view of the aforementioned power semiconductor module device 800 are shown in FIGS. 7A and 7B respectively. The power semiconductor module device 800 includes the semiconductor module 600 and the conversion adaptor 700. The recess of the engagement portion 620 of the power semiconductor module 600 and the protrusion of the second fixation portion 720 of the terminal conversion adaptor 700 are fitted into each other. The terminal conversion adaptor 700 is fitted onto the power semiconductor module 600 from the direction of the upper surface 611 of the power semiconductor module 600. In this condition, the first fixation portion 630 and the second fixation portion 720 are arranged in line with each other and the screw insertion hole 631 and the screw insertion hole 721 are arranged in line with each other. Accordingly, one common fixation screw S can be inserted into the insertion hole 631 and the insertion hole 721 communicating with each other, and fastened to a corresponding screw hole of the cooler so that the power semiconductor module device 800 can be fixed to the cooler.

The reason why the second fixation portion 720 of the terminal conversion adaptor 700 is provided in one place will be explained here. When the terminal conversion adaptor 700 is fitted to the power semiconductor module 600, the support member 710 of the terminal conversion adaptor 700 is placed on the external connection terminals 640. Since the external connection terminals 640 of the power semiconductor module 600 are supported by the protruding portion of the casing 610 under the external connection terminals 640, enough strength to temporarily fix the support member 710 of the terminal conversion adaptor 700 to the external connection terminals 640 can be secured. When the number of engagement portions is reduced to one, the length of the power semiconductor module device 800 can be shortened.

In the power semiconductor module device 800, the bolt insertion holes 733, the bolt insertion holes 734, and the bolt insertion holes 643 are arranged in line with one another so that terminal fastening bolts B can be screwed down to the hexagonal nuts N retained in the bolt insertion holes 644 when the terminal fastening bolts B are inserted to the external connection terminals 640 of the power semiconductor module 600. In this condition, the external connection terminals 640 of the power semiconductor module 600 are electrically connected to the conversion terminals 730 of the terminal conversion adaptor 700. Further, one ends of the conversion terminals 730 are extended perpendicularly to the upper surface 711 so as to form the pin connection portions 732. In this manner, the pin connection type power semiconductor module device 800 is configured.

Incidentally, it is preferable that the control terminals 650 of the pin connection type power semiconductor module device 800 are inserted and connected into relay portions C1 of relay connectors C and front ends of pin connection portions C2 of the relay connectors C are as high as front ends of the pin connection portions 732 of the conversion terminals 730. In such a condition, the pin connection portions 732 and C2 of the power semiconductor module device 800 can be inserted and connected into hole-including terminals of a not-shown printed circuit board etc.

According to the aforementioned configuration, the pin connection type power semiconductor module device 800 can be produced easily from the screw connection type power semiconductor module 600 and the terminal conversion adaptor 700.

Although the embodiments of the screw connection type power semiconductor module device and the pin connection type power semiconductor module device based on the invention have been described above specifically and respectively, the invention is not limited only to the aforementioned embodiments but may include forms which will be described as follows.

The horizontal section of the power semiconductor module is not limited to a rectangle but may be a polygon such as a hexagon or an octagon or a polygon in which a protrusion or a recess is added to the first-mentioned polygon. The support member of the terminal conversion adaptor can be formed into a shape which can be tangent to at least three sides of the polygon forming the outer circumference of the power semiconductor module. When the support member of the terminal conversion adaptor is tangent to at least three sides of the polygon, integrity between the power semiconductor module and the terminal conversion adaptor can be increased so that mechanical strength of the power semiconductor module device can be enhanced.

In the pin connection type power semiconductor module device, the external connection terminal portions of the screw connection type power semiconductor module play roles of engagement and mechanical enforcement. Accordingly, the number of engagement places in the terminal conversion adaptor can be reduced to one. However, the number of engagement places of engagement portions may be set at two or more. When there are two or more engagement places, the attachment posture of the terminal conversion adaptor can be stabilized preferably. When one engagement portion is formed as a recess, it is preferable that the other engagement portion is formed as a protrusion to be fitted into and engaged with the one engagement portion substantially with little clearance. Although the engagement portion of the power semiconductor module is engaged with the fixation portion of the terminal conversion adaptor in the embodiment, special engagement portions may be provided in both the power semiconductor module and the terminal conversion adaptor.

The number of places of the fixation portions of the power semiconductor module and/or the terminal conversion adaptor is not limited to two but may be two or more. Although each first fixation portion 130 of the power semiconductor module and each second fixation portion of the terminal conversion adaptor may be fixed to the cooler through one common screw, the fixation portions may be arranged in different positions from each other and fixed to the cooler through screws individually. In addition, an indirect fixation method may be used to fix the second fixation portion to a part of the first fixation portion and fix the first fixation portion to the cooler. Among the aforementioned fixation methods, the method of fixing the first fixation portion 130 of the power semiconductor module and the second fixation portion of the terminal conversion adaptor to the cooler through one common screw is particularly preferable because it can reduce the installation area.

In addition, the method of fixing each conversion terminal is not limited to the method of embedding and fixing into the support member but may be a fixing method using a screw or an engagement claw. The method of screwing the terminal fastening bolt is not limited to the method of embedding the hexagonal nut in the insertion hole but may be a method of directly threading the insertion hole or a method of directly threading the conversion terminal. The method of connecting the external connection terminals and/or the control terminals of the power semiconductor module is not limited to the method of pin connection using soldering but may be a solderless connection method using press fit pins. In this case, although the pin connection portion of each conversion terminal may be designed to make connection using a press fit pin, the press fit pin may be soldered. Further, a detachable connector may be used on the side where the pin-shaped external connection terminal is received.

What is claimed is:

1. A power semiconductor module device comprising:
    a power semiconductor module having
        an external connection terminal of a first connection type, the external connection terminal being disposed on an outer edge of the power semiconductor module and
        a first fixation portion including a first engagement portion; and
    a terminal conversion adaptor including
        a conversion member made of a conductive material, and being configured to convert the external connection terminal from the first connection type to a second connection type different from the first connection type, the conversion member including
            a first connection portion that has the first connection type, the first connection portion being configured to be connected to the external connection terminal, and
            a second connection portion that has the second connection type, the second connection portion being configured to be connected to another device that has the second connection type,
        an insulating support member supporting the conversion member, and
        a second fixation portion including a second engagement portion, the first engagement portion being engageable with the second engagement portion, thereby enabling the power semiconductor module to be removably fixed to the terminal conversion adaptor.

2. The power semiconductor module device according to claim 1, wherein:
    the first fixation portion is configured to be fixed to a cooler; and
    the support member includes the second fixation portion.

3. The power semiconductor module device according to claim 2, wherein one of the first and second engagement portions is a recess, and the other one of the first and second engagement portions is a protrusion that engages with the recess.

4. The power semiconductor module device according to claim 2, wherein the first fixation portion and the second fixation portion are fixed to each other through one screw that penetrates through both the first fixation portion and the second fixation portion.

5. The power semiconductor module device according to claim 1, wherein:
- the first connection type of the external connection terminal of the power semiconductor module is a screw connection, both the external connection terminal and the first connection portion each including a screw hole in which a screw is tightened; and
- the second connection type of the second connection portion of the terminal conversion adaptor is an insertion connection, one of the second connection portion and a portion of the other device to which the power semiconductor module is fixed being a pin, another of the second connection portion and the portion of the other device being a pin-hole in which the pin is inserted.

6. The power semiconductor module device according to claim 5, wherein:
- the second connection portion includes a pin-shaped terminal portion; and
- the insertion connection is performed by inserting the pin-shaped terminal portion of the second connection portion into a hole-including terminal portion of the other device and soldering each other.

7. The power semiconductor module device according to claim 5, wherein one of the external connection terminal of the power semiconductor module and the first connection portion of the terminal conversion adaptor includes a through hole and the other one of the external connection terminal of the power semiconductor module and the first connection portion of the terminal conversion adaptor includes a screw hole, a bolt being inserted into the through hole and threaded into the screw hole, thereby fixing the first connection portion to the external connection terminal.

8. The power semiconductor module device according to claim 1, wherein:
- the first connection type of the external connection terminal of the power semiconductor module is an insertion connection, one of the external connection terminal and the first connection portion being a pin, another of the external connection terminal and the first connection portion being a pin-hole in which the pin is inserted; and
- the second connection type of the second connection portion of the terminal conversion adaptor is a screw connection, both the second connection portion and a portion of the other device to which the power semiconductor module is fixed the external connection terminal each including a screw hole in which a screw is tightened.

9. The power semiconductor module device according to claim 8, wherein:
- the first connection portion includes a hole-including terminal portion;
- the external connection terminal includes a pin-shaped terminal portion;
- the insertion connection is performed by inserting the pin-shaped terminal portion of the external connection terminal into the hole-including terminal portion of the first connection portion and soldering each other.

10. The power semiconductor module device according to claim 8, wherein one of the second connection portion and the other device includes a through hole and the other one of the second connection portion and the other device includes a screw hole, a bolt being inserted into the through hole and threaded into the screw hole, thereby fixing the second connection portion to the other device.

11. The power semiconductor module device according to claim 1, wherein the terminal conversion adaptor is disposed in direct contact with a side surface of the power semiconductor module.

12. The power semiconductor module device according to claim 1, wherein the terminal conversion adaptor is disposed in direct contact with an upper surface of the power semiconductor module.

13. The power semiconductor module device according to claim 1, wherein:
- in a cross-sectional view, an outer shape of the power semiconductor module is a polygon; and
- the support member is formed into a shape which is in direct contact with at least three sides of the polygon shape.

14. A terminal conversion adaptor for being connected with an external connection terminal of a first connection type included in a power semiconductor module, the terminal conversion adaptor comprising:
- a conversion member made of a conductive material, and being configured to convert the external connection terminal from the first connection type to a second connection type different from the first connection type, the conversion member including
  - a first connection portion that has the first connection type, the first connection portion being configured to be connected to the external connection terminal of the power semiconductor module, and
  - a second connection portion that has a second connection type different from the first connection type, the second connection portion being configured to be connected to another device that has the second connection type, thereby converting the power semiconductor module from the first connection type to the second connection type for the other device;
- an insulating support member supporting the conversion member; and
- a fixation portion including an engagement portion, the engagement portion being engageable with another engagement portion of the power semiconductor module, thereby enabling the power semiconductor module to be removably fixed to the terminal conversion adaptor.

15. A power semiconductor module device, comprising:
- a power semiconductor module having an external connection terminal of a first connection type, the external connection terminal being disposed on an outer edge of the power semiconductor module; and
- a terminal conversion adaptor including
  - a conversion member made of a conductive material, configured to convert the first connection type of the power semiconductor module to a second connection type different from the first connection type, and
  - an insulating support member, the conversion member including
    - a first connection portion that has the first connection type, the first connection portion being configured to connected to the external connection terminal, and
    - a second connection portion that has the second connection type, the second connection portion being configured to be connected to another device that has the second connection type, the insulating support member supporting the conversion member, wherein:

in a cross-sectional view, an outer shape of the power semiconductor module is a polygon; and the support member is formed into a shape which is tangent to at least two sides of the polygon of the outer shape of the power semiconductor module.

* * * * *